US006395623B1

(12) United States Patent
Juengling

(10) Patent No.: US 6,395,623 B1
(45) Date of Patent: May 28, 2002

(54) SEMICONDUCTOR PROCESSING METHODS OF FORMING A CONTACT OPENING TO A CONDUCTIVE LINE AND METHODS OF FORMING SUBSTRATE ACTIVE AREA SOURCE/DRAIN REGIONS

(75) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/141,777

(22) Filed: Aug. 27, 1998

(51) Int. Cl.[7] ............................................. H01L 21/425
(52) U.S. Cl. ..................... 438/533; 438/199; 438/233; 438/306
(58) Field of Search ................................. 438/199, 233, 438/302–303, 305–306, 523, 533, 592, 595

(56) References Cited

U.S. PATENT DOCUMENTS

| | | | | |
|---|---|---|---|---|
| 4,232,439 A | * | 11/1980 | Shibata | 438/302 |
| 4,343,657 A | * | 8/1982 | Ito et al. | 438/250 |
| 4,734,383 A | * | 3/1988 | Ikeda et al. | 438/233 |
| 5,017,506 A | | 5/1991 | Shen et al. | 438/386 |
| 5,459,085 A | * | 10/1995 | Pasen et al. | 438/302 |
| 5,637,525 A | * | 6/1997 | Dennison | 438/232 |
| 5,656,520 A | * | 8/1997 | Watanabe | 438/305 |
| 5,668,065 A | * | 9/1997 | Lin | 438/303 |
| 5,686,324 A | * | 11/1997 | Wang et al. | 438/34 |
| 5,731,236 A | * | 3/1998 | Chou et al. | 438/253 |
| 5,731,242 A | * | 3/1998 | Parat et al. | 438/586 |
| 5,766,992 A | * | 6/1998 | Chou et al. | 438/241 |
| 5,795,809 A | * | 8/1998 | Gardner et al. | 438/402 |
| 5,821,140 A | | 10/1998 | Jost et al. | 438/241 |
| 5,856,227 A | * | 1/1999 | Yu et al. | 438/305 |
| 5,985,711 A | * | 11/1999 | Lim | 438/229 |
| 6,015,730 A | * | 1/2000 | Wang et al. | 483/241 |
| 6,025,255 A | * | 2/2000 | Chen et al. | 438/595 |
| 6,165,880 A | * | 12/2000 | Yaung et al. | |
| 6,177,339 B1 | | 1/2001 | Juengling | 438/637 |

OTHER PUBLICATIONS

Wolf et al, Silicon Processing for the VLSI Era, vol. 1: Process Technology, 1986, Lattice Press, p. 283.*
Microchip Fabrication—Second Edition, McGraw–Hill ©1990, p. 332 only.

* cited by examiner

Primary Examiner—Michael Trinh
Assistant Examiner—Jamie L. Brophy
(74) Attorney, Agent, or Firm—Wells St. John P.S.

(57) ABSTRACT

In one aspect, the invention provides a method of forming a contact opening to a conductive line. In one preferred implementation, a contact opening is formed to a conductive line which overlies a substrate isolation area with an etch which also outwardly exposes substrate active area to accommodate source/drain doping. In another preferred implementation, desired PMOS regions over a substrate into which p-type impurity is to be provided are exposed while a contact opening is contemporaneously formed to at least one conductive line extending over substrate isolation oxide. In another preferred implementation, a contact opening to a conductive line over a substrate and an opening to a laterally spaced substrate active area are formed in a common masking step. In another preferred implementation, desired PMOS active areas over a substrate are exposed and p-type impurity to a first concentration is provided into desired exposed areas. A masking layer is formed over the substrate and subsequently patterned and etched to form openings over source/drain regions. P-type impurity is provided through the openings into the source/drain regions to a second concentration which is greater than the first concentration.

12 Claims, 5 Drawing Sheets

US 6,395,623 B1

SEMICONDUCTOR PROCESSING METHODS OF FORMING A CONTACT OPENING TO A CONDUCTIVE LINE AND METHODS OF FORMING SUBSTRATE ACTIVE AREA SOURCE/DRAIN REGIONS

TECHNICAL FIELD

This invention relates to semiconductor processing methods of forming integrated circuitry and in particular, to methods of forming complementary metal oxide semiconductor (CMOS) circuitry. The invention also relates to semiconductor processing methods of forming a contact opening to a conductive line.

BACKGROUND OF THE INVENTION

High density integrated circuitry is principally fabricated from semiconductor wafers. An MOS (metal-oxide-semiconductor) structure in semiconductor processing is created by superimposing several layers of conducting, insulating and transistor forming materials. After a series of processing steps, a typical structure might comprise levels of diffusion, polysilicon and metal that are separated by insulating layers. Upon fabrication completion, a wafer contains a plurality of identical discrete die areas which are ultimately cut from the wafer to form individual chips. Die areas or cut dies are tested for operability, with good dies being assembled into separate encapsulating packages which are used in end-products or systems.

CMOS is so-named because it uses two types of transistors, namely an n-type transistor (NMOS) and a p-type transistor (PMOS). These are fabricated in a semiconductor substrate, typically silicon, by using either negatively doped silicon that is rich in electrons or positively doped silicon that is rich in holes. Different dopant ions are utilized for doping the desired substrate regions with the desired concentration of produced holes or electrons.

NMOS remained the dominant MOS technology as long as the integration level devices on a chip was sufficiently low. It is comparatively inexpensive to fabricate, very functionally dense, and faster than PMOS. With the dawning of large scale integration, however, power consumption in NMOS circuits began to exceed tolerable limits. CMOS represented a lower-power technology capable of exploiting large scale integration fabrication techniques.

Fabrication of semiconductor circuitry includes numerous processing steps in which certain areas of a semiconductor substrate are masked while other areas are subjected to processing conditions such as various etching steps and doping steps. In an effort to optimize semiconductor processing, efforts in the industry have been focused on reducing the number of processing steps in any particular processing flow. Reducing the number of processing steps required in a particular processing flow saves valuable processing time and subjects the wafer to less risk of destruction.

In typical CMOS processing, separate photomasking processing steps are utilized to both open up contact openings to conductive lines formed over the substrate, as well as to expose substrate active areas into which dopants or conductivity changing impurity were to be added. Such separate processing of course adds to processing time and effort. It is desirable to reduce the number of required processing steps associated with forming integrated circuitry. It is also desirable to improve upon current semiconductor processing techniques.

This invention arose out of concerns associated with reducing the number of processing steps required to produce integrated circuitry in particular CMOS circuitry. This invention also grew out of concerns associated with improving formation of PMOS active area diffusion regions associated with CMOS circuitry.

SUMMARY OF THE INVENTION

In one aspect, the invention provides a method of forming a contact opening to a conductive line. In one preferred implementation, an etch is conducted to form a contact opening to a conductive line which overlies a substrate isolation area. The same etch also, preferably, outwardly exposes substrate active area to accommodate source/drain doping. In another preferred implementation, desired PMOS regions over a substrate into which p-type impurity is to be provided are exposed while a contact opening is contemporaneously formed to at least one conductive line extending over substrate isolation oxide. In another preferred implementation, a contact opening to a conductive line over a substrate and an opening to a laterally spaced substrate active area are formed in a common masking step.

In another preferred implementation, desired PMOS active areas over a substrate are exposed and p-type impurity to a first concentration is provided into desired exposed areas. Such preferably defines at least a portion of source/drain regions to be formed. A masking layer is formed over the substrate and subsequently patterned and etched to form openings over desired source/drain regions. P-type impurity is then provided through the openings and into the source/drain regions to a second concentration which is greater than the first concentration.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
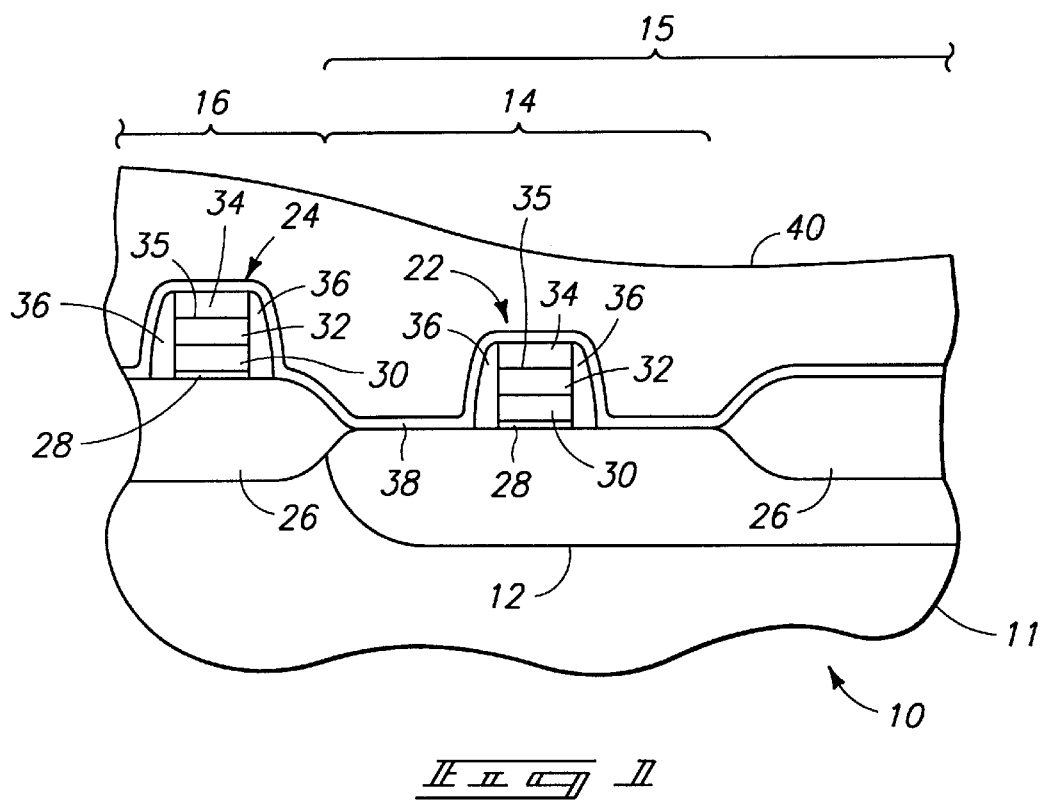
FIG. 1 is a cross-sectional view of a semiconductor wafer fragment at one processing step in accordance with the invention.

Referring to FIG. 1, a semiconductive substrate in process is indicated generally with reference numeral 10. Preferably, such is comprised of a bulk monocrystalline silicon substrate 11 having various layers deposited or otherwise formed thereover. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Semiconductive substrate 10, in the illustrated and preferred embodiments is undergoing processing in which CMOS circuitry is formed. Accordingly, an n-well 12 is provided within substrate 11 for supporting the formation of PMOS circuitry and comprises PMOS active area region 14 within PMOS region 15. Corresponding NMOS circuitry is depicted by reference numeral 16 and comprises a conductive line 24 in the illustrated cross section. Line 24 is operatively connected to corresponding NMOS active area regions which are not specifically shown.

Typically, active area regions such as PMOS active area region 14 include at least one conductive line 22 which extends thereover and provides a gate line stack for MOS transistors to be subsequently formed. According to one aspect of the invention, lines 22 and 24 comprise conductive gate or word lines which overlie one or more field isolation regions, areas or field oxide regions such as regions or areas 26 which extend into and out of the page. Other conductive lines, and ones which do not necessarily extend over the to-be-described PMOS and NMOS active areas can undergo processing in accordance with the invention, as will become apparent below.

In accordance with one preferred methodical aspect of the invention, desired PMOS active area regions 14 are exposed over semiconductive substrate 10 while a contact opening to at least one conductive line is formed. Preferably, the PMOS region is exposed and the contact opening is formed using a common masking step. This is advantageous because at least one masking step can be eliminated in the process flow.

Conductive line 22 includes a gate oxide layer 28 atop which a polysilicon layer 30, a silicide layer 32 and a protective nitride containing cap or capping layer 34 are formed. Sidewall spacers 36 are preferably formed from a suitable nitride material and overlie sidewalls of the gate line. Together, nitride cap 34 and sidewall spacers 36 form a protective nitride encapsulation layer over conductive gate line 22. Conductive line 24 is preferably formed contemporaneously with conductive line 22. Accordingly, it as well comprises gate oxide layer 28, polysilicon layer 30, silicide layer 32, protective nitride containing cap or capping layer 34 and protective sidewall spacers 36. As with conductive line 22, nitride containing cap or capping layer 34 together with sidewall spacers 36 form a protective nitride encapsulation layer over conductive line 24. For purposes of ongoing discussion, conductive lines 22, 24 comprise a plurality of layers which were previously formed over semiconductive substrate 10, and subsequently etched to form or produce the conductive lines. The illustrated and preferred conductive lines have respective conductive line tops 35 over which the protective nitride material 34 is formed.

Referring still to FIG. 1, a thin layer of oxide 38 is formed preferably through decomposition of tetraethylorthosilicate (TEOS). An oxide layer 40, preferably borophosphosilicate glass (BPSG), is formed 24 thereover.

Figure 2:
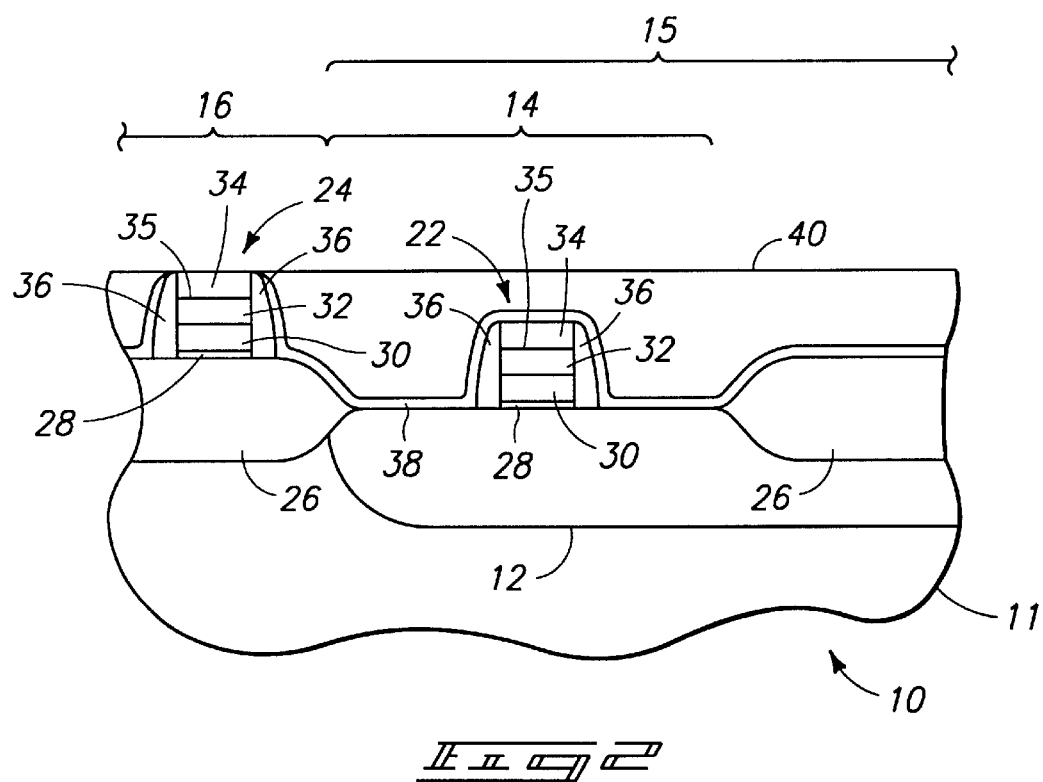
FIG. 2 is a cross-sectional view of the FIG. 1 semiconductor wafer fragment at a processing step subsequent to that shown by FIG. 1.

Referring to FIG. 2, layer 40 is planarized, as by suitable mechanical abrasion of semiconductive substrate 10. An example mechanical abrasion process is chemical-mechanical planarization. Other planarization techniques are of course possible.

Figure 3:
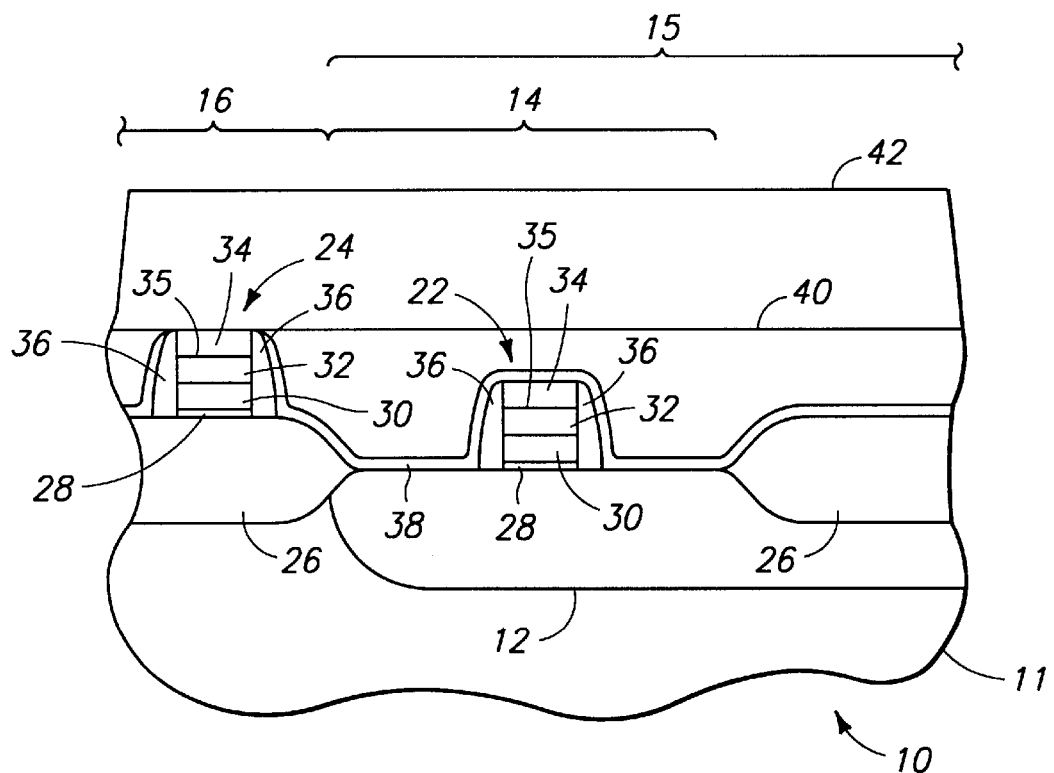
FIG. 3 is a cross-sectional view of the FIG. 1 semiconductor wafer fragment at a processing step subsequent to that shown by FIG. 2.
Figure 4:
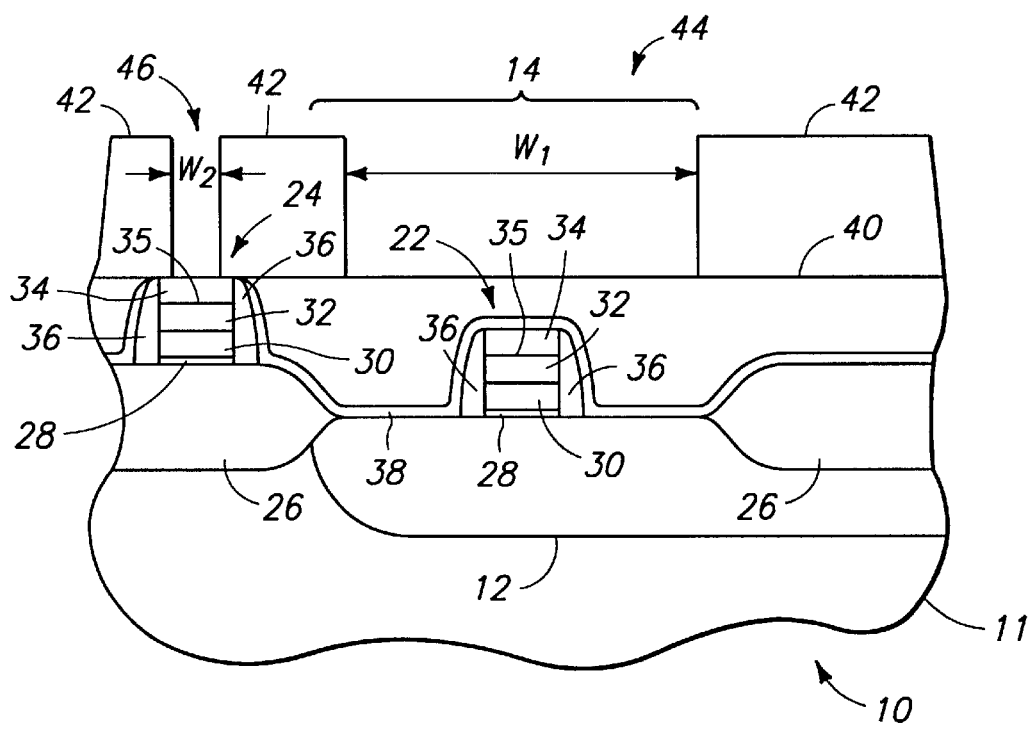
FIG. 4 is a cross-sectional view of the FIG. 1 semiconductor wafer fragment at a processing step subsequent to that shown by FIG. 3.

Referring to FIGS. 3 and 4, a layer of photoresist 42 is formed over semiconductive substrate 10 (FIG. 3) and subsequently patterned (FIG. 4) to form or define a doping window 44 over PMOS active region 14, and a contact opening 46 over conductive line 24. In the illustrated and preferred embodiment, doping window 44 has a first open lateral width dimension $W_1$ and contact opening 46 has a second open lateral width dimension $W_2$. Second open lateral width dimension $W_2$ is less than the first open lateral width dimension $W_1$.

Figure 5:
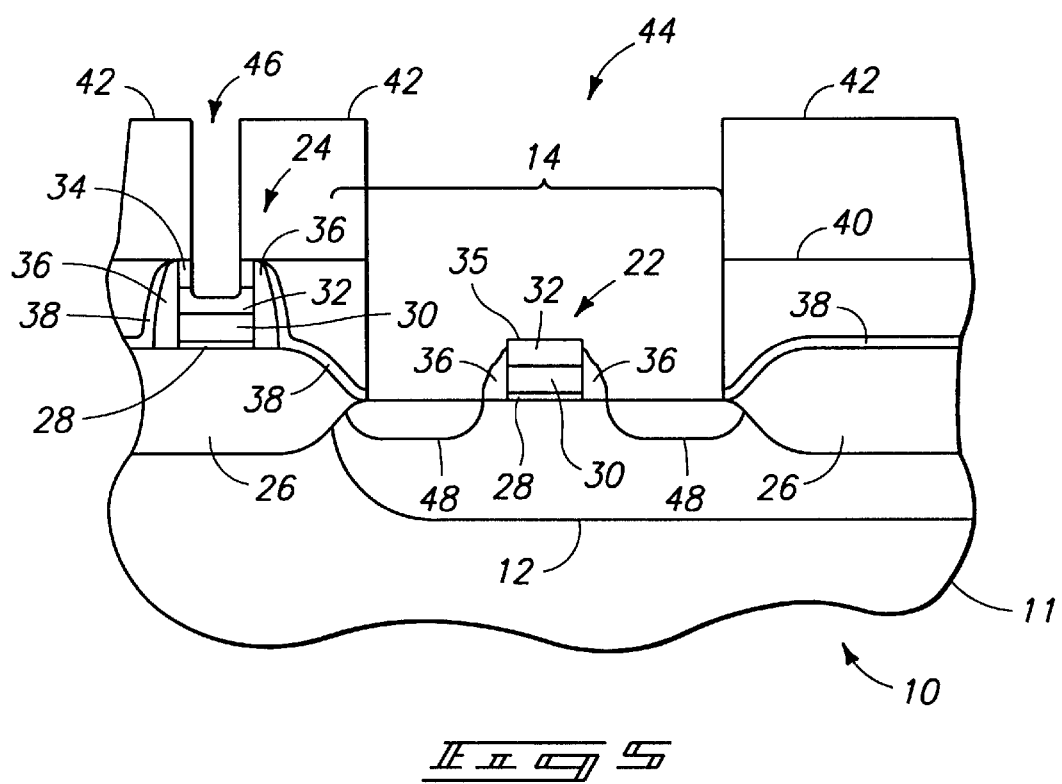
FIG. 5 is a cross-sectional view of the FIG. 1 semiconductor wafer fragment at a processing step subsequent to that shown by FIG. 4.

Referring to FIG. 5, and in the illustrated common masking step, oxide layers 40 and 38 are etched downwardly to outwardly expose PMOS active area region 14, and more specifically, to expose PMOS active areas into which p-type impurity is to be provided. In the same step, contact opening 46 is formed or etched over conductive line 24 overlying the field isolation region 26. As shown, the etch forming contact opening 46 will typically remove at least some of the nitride material forming nitride cap 34 and hence outwardly expose a portion of silicide layer 32 thereunder. Accordingly, the etch also removes the nitride cap over conductive gate line 22 and etches spacers 36 downwardly as shown. At this point, enough of the oxide layer over the substrate active area has typically been removed to outwardly expose desired source/drain regions and accommodate doping of the source/drain regions with p-type impurity adjacent gate line 24.

According to one aspect of the invention, the contact opening is formed and the substrate active area is exposed utilizing one anisotropic etch which preferably etches oxide material and nitride material at substantially the same rate. Alternately, two separate etches can be used to expose the substrate active area. An exemplary etch can be a first anisotropic dry etch followed by a wet etch. Other etching regimes are of course possible.

Referring still to FIG. 5, and at a processing point where the illustrated patterned photoresist is still in place over the substrate, p-type impurity is provided into the substrate to form diffusion regions 48. As provided, diffusion regions 48 define at least portions of desired doped source/drain regions. Suitable p-type dopants include boron, $BF_2$, and the like. Such doping of regions 48 can be carried out, for example, by ion implantation. One preferred method is angled ion doping at some significant angle from vertical (i.e. between about 0° and 45°), with substrate 10 being rotated during such doping. Other angles are possible. Such angled ion doping results in little, if any, dopant reaching the exposed portion of conductive line 24. This is because the lateral width of doping window 44 provides a much larger target area than the relatively narrow lateral width of the contact opening 46 over conductive line 24.

Figure 6:
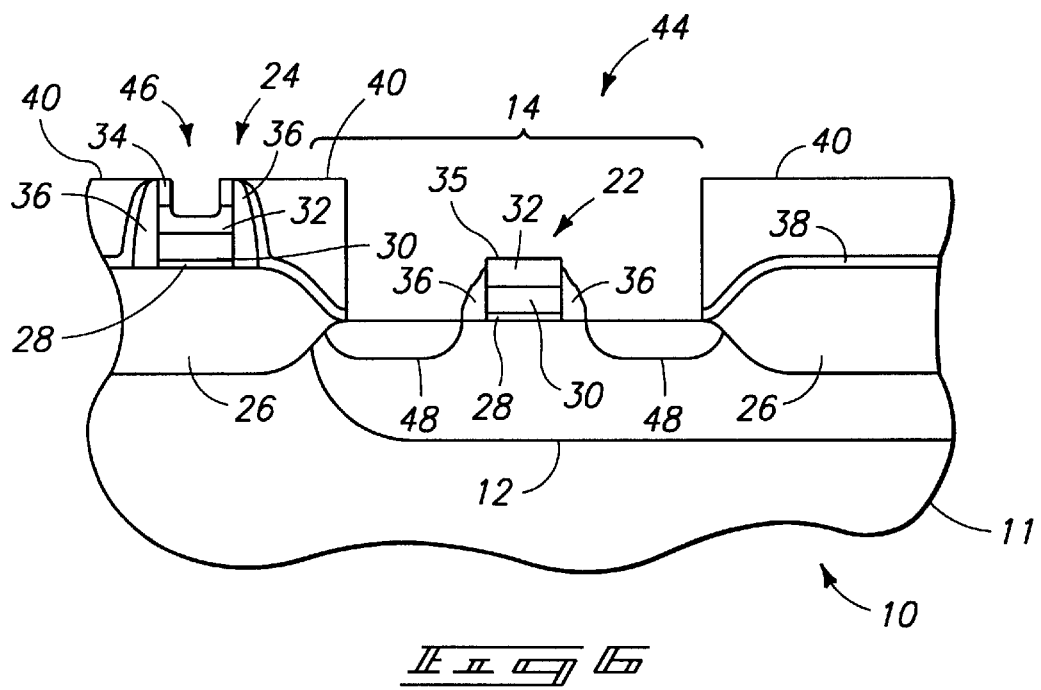
FIG. 6 is a cross-sectional view of the FIG. 1 semiconductor wafer fragment at a processing step subsequent to that shown by FIG. 5.

Alternately and more preferred, the patterned photoresist 42 is stripped as shown in FIG. 6 prior to forming diffusion regions 48. A preferred doping technique in such instance is gas chemical diffusion. One advantage of gas chemical diffusion over the above described ion implantation is the formation of shallower junctions having heavier surface doping. Shallower junctions are advantageous because less lateral diffusion occurs during downstream heat processing of the substrate. Heavier surface doping is advantageous because such desirably reduces contact resistance when contacts are subsequently formed or made to such regions. Accordingly, such provides an example of forming PMOS source/drain regions over semiconductive substrate 10 in the absence of any photoresist over NMOS regions of the substrate. Such can however result in provision of PMOS dopant within a portion of the lateral width of line 24 and particularly silicide layer 32. Any conductivity change resulting from the introduction of dopant into silicide layer 32 is, to a desirable extent, mitigated by the narrower width of opening 46 as compared to the lateral width of line 24 itself. Accordingly, circuit operability is maintained.

Alternately, processing the substrate in accordance with the above-described approach could also be used to effect formation of NMOS source/drain regions over a substrate in the absence of any photoresist over PMOS regions of the substrate.

Figure 7:
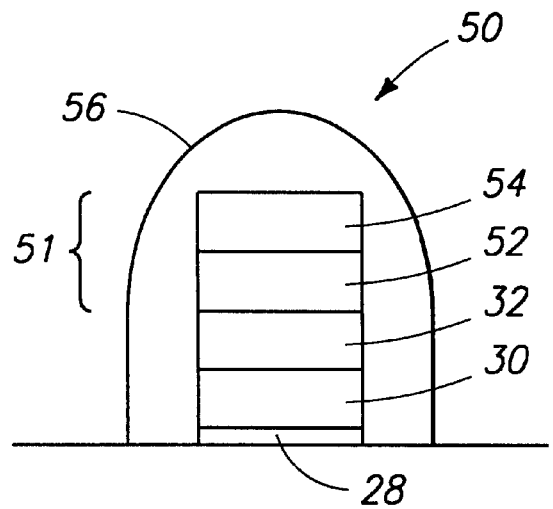
FIG. 7 is a cross-sectional view of an alternate conductive line construction made in accordance with the invention.

Referring to FIG. 7, an alternate conductive line and/or gate stack 50 is shown. Such construction can be used to mitigate the above-described etch into silicide layer 32 of conductive line 24 (FIGS. 5 and 6) when the doping window and contact opening 46 are formed. In the figure, like elements have been similarly designated. Accordingly, line 50 comprises a conductive portion atop a gate oxide layer 28. The conductive portion comprises polysilicon layer 30 and silicide layer 32 thereatop. Line 50 also includes a protective portion or capping layer 51 formed over the conductive portion. According to a preferred aspect of the invention, the protective portion includes a nitride layer 52 deposited to a thickness of around 300 Angstroms, and an oxide layer 54 elevationally outwardly of and atop the nitride layer. Layer 54 can be provided by suitable decomposition of TEOS, with an example thickness for layer 54 being around 200 to 600 Angstroms. A nitride encapsulation material 56 is subsequently provided or formed over the conductive line. Hence when contact opening 46 is formed as described above, at least some of the nitride encapsulation material 56 and some of the protective portion, including upper oxide portion 54 are removed. Preferably, such removed portions leave behind enough of nitride layer 52 to provide a protective cap or cover over the conductive line. One manner of forming contact opening 46 which capitalizes on such alternate conductive line is to first etch or otherwise remove a portion of nitride encapsulation material 56 substantially selective to oxide portion 54, and then to remove at least a portion of oxide portion 54 substantially selective to nitride layer 52. Such leaves at least some of nitride layer 52 over silicide layer 32 which desirably shields the underlying conductive portion of line 50 during the p-type doping described above.

The above described methodology enables contemporaneous formation of a contact opening to at least one conductive line and exposure of desired substrate active regions or areas into which dopants or impurities are to be provided. According to a preferred aspect of the invention, the desired substrate active areas comprise PMOS active areas which form part of a CMOS integrated circuit. According to another preferred aspect of the invention, the contact opening is formed to a conductive line which includes a portion which extends over substrate active area and which provides a conductive gate or word line thereto. In one implementation, such conductive line overlies a field isolation region and extends laterally away therefrom and over a substrate active area. Such process represents an improvement over previous processes in at least the following ways. First, a masking step can be eliminated. Second, a heavier p-type doping step is conducted much later in the processing flow which minimizes undesired thermally-effected diffusion of p+ regions, as such are not subjected to as much thermal processing as if such were formed earlier in the process. Third, gas phase doping can take place to form desired substrate diffusion regions instead of the above-described ion implantation.

Figure 8:
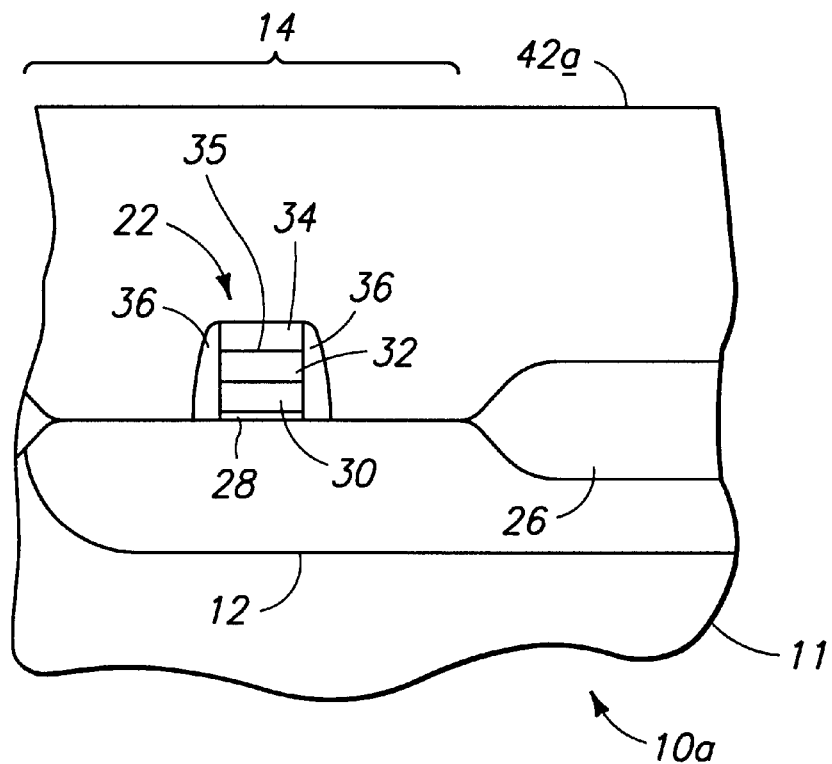
FIG. 8 is a cross-sectional view of the FIG. 1 semiconductor wafer fragment at an alternate processing step subsequent to that shown in FIG. 3.
Figure 9:
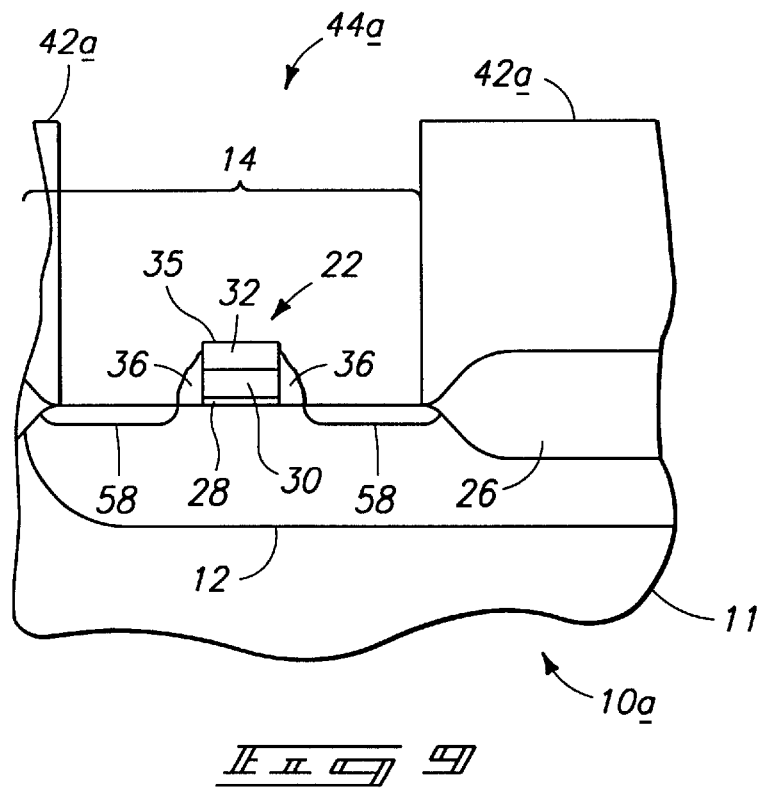
FIG. 9 is a cross-sectional view of the FIG. 8 semiconductor wafer fragment at a processing step subsequent to that shown by FIG. 8.
Figure 10:
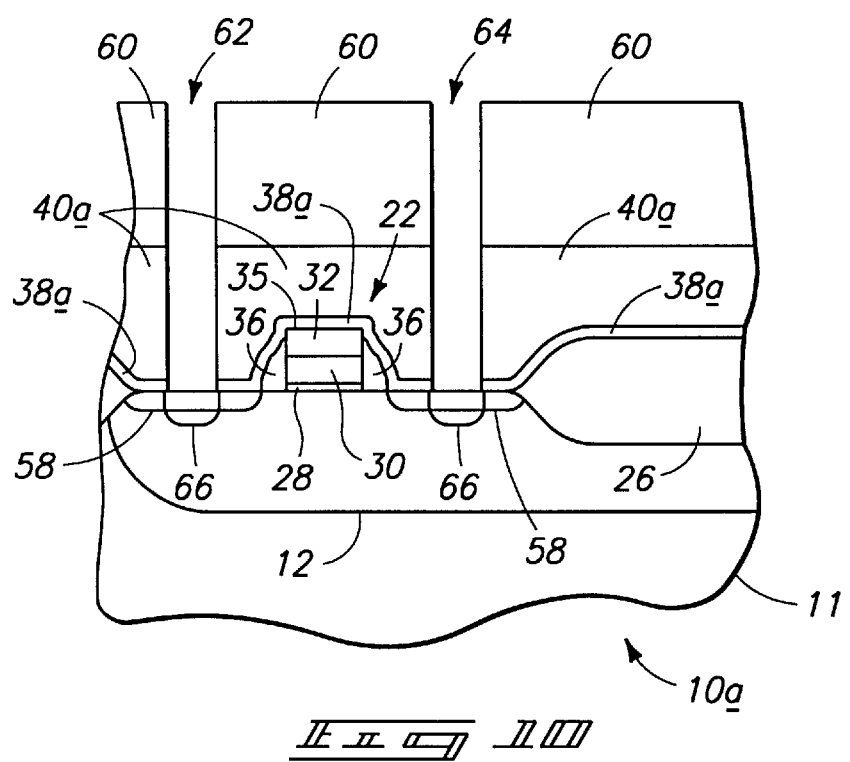
FIG. 10 is a cross-sectional view of the FIG. 8 semiconductor wafer fragment at a processing step subsequent to that shown by FIG. 9.

Referring to FIGS. 8–10, a process methodology is described which is advantageous in that such lowers contact resistance for subsequently formed contacts to p+ diffusion regions. Like numbers from the first described embodiment are utilized where appropriate, with differences being indicated with the suffix "a" or with different numerals. Such process provides a better "off" state for PMOS transistors by minimizing lateral spread of the high concentration of the p+ material in PMOS source/drains. Such greatly reduces the risk of current leakage beneath the gates in channel regions.

Semiconductive substrate 10a is shown in FIG. 8 at a processing step before layers 38 and 40 are deposited in FIG. 3. A photoresist layer 42a is formed over substrate 10a.

Referring to FIG. 9, photoresist layer 42a is suitably patterned to define a doping window 44a over PMOS active area 14 and not the above described contact opening 46 (FIG. 4). P-type impurity is provided into exposed substrate source/drain active area regions to a first concentration. A suitable concentration of p-type impurity is between about $1 \times 10^{18} \text{cm}^{-3}$ and $1 \times 10^{20} \text{cm}^{-3}$. Such defines p-type diffusion first regions 58. Thereafter, photoresist layer 42a is removed and layers 38a and 40a can be deposited and planarized as in FIG. 3.

Referring to FIG. 10, a masking layer 60 is formed over the substrate and subsequently layers 40a and 38a are patterned and etched to form openings 62, 64 over diffusion first regions 58. Such etch may advantageously be the same etch which opens up contact opening 46 (FIG. 4) to conductive line 24. Openings 62, 64 are smaller in cross-section than the diffusion regions over which such are formed. P-type impurity is then provided through openings 62, 64 to a second concentration which is greater than the first concentration. An exemplary concentration of p-type impurity is between $1 \times 10^{20} \text{cm}^{-3}$ and $5 \times 10^{20} \text{cm}^{-3}$. Such forms p-type diffusion second regions 66 which constitute at least a portion of the source/drain regions. The remainder of the processing to form the desired circuitry can take place in accordance with practices understood and appreciated by those of skill in the art.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A semiconductor processing method of forming PMOS circuitry having PMOS source/drain regions over a semiconductor substrate comprising:

exposing desired PMOS source/drain active areas over the substrate;

providing p-type impurity to a first concentration into the exposed PMOS source/drain active areas;

forming a masking layer over the substrate;

patterning and etching the masking layer to form openings over the PMOS source/drain active areas; and providing p-type impurity through the openings into the PMOS source/drain active areas to a second concentration which is greater than the first concentration, wherein the patterning and etching comprises forming at least one contact opening to a conductive line formed over the substrate.

2. The semiconductor processing method of claim 1, further comprising forming NMOS circuitry over the substrate, the PMOS circuitry and the NMOS circuitry collectively defining CMOS circuitry.

3. The semiconductor processing method of claim 1, wherein the openings are smaller in cross section than the source/drain regions.

4. A semiconductor processing method of forming a contact opening to a conductive word line which overlies a substrate active area comprising:

forming a conductive word line over a substrate, a portion of the word line overlying a field isolation region and extending laterally away therefrom and over a substrate active area;

encapsulating the word line with nitride encapsulating material;

forming an oxide layer over the substrate, the oxide layer covering the conductive word line and the substrate active area; and in a common step, patterning and etching the oxide layer to outwardly expose at least one desired substrate active area into which p-type impurity is to be provided, the etching also forming the contact opening to that portion of the conductive word line overlying the field isolation region, wherein the etching step etches the oxide material at substantially the same rate as the nitride encapsulating material.

5. A semiconductor processing method comprising:

forming at least one conductive gate line over a substrate, the gate line including a silicide layer, the gate line overlying a field isolation region and extending laterally away therefrom and over substrate active area;

providing a nitride material over the silicide layer;

forming an oxide layer over the at least one conductive line and the substrate active area; and conducting an anisotropic etch to a degree sufficient to: (a) remove at least some of the nitride material over the conductive line to define a contact opening thereto and, (b) remove enough of the oxide layer over the substrate active area to expose source/drain regions into which p-type impurity is to be added, wherein the nitride material and the oxide layer are etched at substantially the same rate.

6. The semiconductor processing method of claim 5 further comprising gas diffusion doping the exposed source/drain regions with a p-type impurity.

7. A semiconductor processing method of forming a contact opening to a conductive line comprising:

forming a conductive line over a substrate, the conductive line having a conductive portion and a protective portion over the conductive portion, the protective portion comprising at least a silicon nitride layer atop the conductive line and a silicon oxide layer atop the silicon nitride layer, at least a part of the conductive line extending over a substrate active area;

forming silicon nitride encapsulation material over the conductive line and its protective portion; and in a common masking step, etching a doping window opening over the substrate active area adjacent the line and removing at least some of the silicon nitride encapsulation material and some of the protective portion of the conductive line to form a contact opening to the conductive line.

8. A semiconductor method of forming a conductive line comprising:

forming a conductive gate stack atop a substrate;

forming a silicon nitride layer atop the gate stack;

forming a silicon oxide layer atop the silicon nitride layer;

forming silicon nitride encapsulation material over the silicon oxide layer, the silicon nitride layer and the conductive gate stack;

selectively removing at least some of the silicon nitride encapsulation material relative to the silicon oxide layer; and selectively removing at least some of the silicon oxide layer relative to the silicon nitride layer, the removing steps defining at least part of a contact opening over the gate stack.

9. A semiconductor CMOS processing method of forming CMOS circuitry comprising:

forming a substrate comprising a plurality of layers;

etching at least some of the plurality of layers to form at least one conductive gate line, the at least one gate line overlying a field isolation region and having a conductive line top;

forming silicon nitride material over at least a portion of the conductive line top;

forming a silicon oxide layer over the silicon nitride material;

planarizing the silicon oxide layer;

forming a photoresist layer over the planarized silicon oxide layer;

in a common masking step, patterning the photoresist layer to form a contact opening over the conductive gate line and a doping window over active area of the substrate adjacent the gate line, the contact opening and the doping window having respective lateral width dimensions, the contact opening width dimension being less than the doping window width dimension;

anisotropically etching both the silicon nitride material and the silicon oxide layer at substantially the same rate to respectively define the contact opening to the conductive gate line and the doping window over the substrate active area adjacent the gate line; and doping desired areas of the substrate active area with a p-type impurity to form at least a portion of one source/drain region.

10. A semiconductor processing method of forming PMOS circuitry having PMOS source/drain regions over a semiconductor substrate comprising:

providing p-type impurity to a first concentration into previously exposed PMOS source/drain active areas formed on the substrate;

forming a masking layer over the substrate;

patterning and etching the masking layer to form openings over the PMOS source/drain active areas; and providing p-type impurity through the openings into the PMOS source/drain active areas to a second concentration which is greater than the first concentration, wherein the patterning and etching comprises forming at least one contact opening to a conductive line formed over the substrate.

11. The semiconductor processing method of claim 10 further comprising forming NMOS circuitry over the substrate, the PMOS circuitry and the NMOS circuitry collectively defining CMOS circuitry.

12. The semiconductor processing method of claim 10, wherein the openings are smaller in cross section than the source/drain regions.

* * * * *

UNITED STATES PATENT AND TRADEMARK OFFICE
CERTIFICATE OF CORRECTION

PATENT NO.    : 6,395,623 B1
DATED         : May 28, 2002
INVENTOR(S)   : Werner Juengling It is certified that error appears in the above-identified patent and that said Letters Patent is hereby corrected as shown below:

Column 4,
Line 8, replace "glass (BPSG), is formed 24 thereover." with -- glass (BPSG), is formed thereover. --

Signed and Sealed this

Fourteenth Day of January, 2003

JAMES E. ROGAN
*Director of the United States Patent and Trademark Office*